United States Patent
Goode et al.

(10) Patent No.: US 11,295,819 B2
(45) Date of Patent: Apr. 5, 2022

(54) DUAL SENSE BIN BALANCING IN NAND FLASH

(71) Applicant: Western Digital Technologies, Inc., San Jose, CA (US)

(72) Inventors: Jonas Goode, Lake Forest, CA (US); Richard Galbraith, Rochester, MN (US); Henry Yip, Bellflower, CA (US); Idan Alrod, Herzliya (IL); Eran Sharon, Rishon Lezion (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/917,291

(22) Filed: Jun. 30, 2020

(65) Prior Publication Data

US 2021/0407598 A1 Dec. 30, 2021

(51) Int. Cl.
*G11C 16/04* (2006.01)
*G11C 16/28* (2006.01)
*G11C 11/56* (2006.01)

(52) U.S. Cl.
CPC .......... *G11C 16/28* (2013.01); *G11C 11/5642* (2013.01); *G11C 11/5671* (2013.01); *G11C 16/0483* (2013.01)

(58) Field of Classification Search
CPC . G11C 16/28; G11C 11/5671; G11C 16/0483; G11C 11/5642
USPC .................................................... 365/185.03
See application file for complete search history.

(56) References Cited

U.S. PATENT DOCUMENTS

| 8,000,135 | B1 | 8/2011 | Perlmutter et al. |
|---|---|---|---|
| 8,923,062 | B1 | 12/2014 | Lee et al. |
| 9,269,448 | B2 * | 2/2016 | Tang .................. G06F 11/1072 |
| 9,484,098 | B1 * | 11/2016 | Hsu ..................... G06F 11/1072 |
| 9,741,431 | B2 | 8/2017 | Kumar et al. |
| 9,842,023 | B2 | 12/2017 | Tang et al. |
| 10,236,070 | B2 | 3/2019 | Barndt et al. |
| 10,347,331 | B2 | 7/2019 | Zhang et al. |
| 2016/0148702 | A1 | 5/2016 | Karakulak et al. |
| 2016/0357631 | A1 | 12/2016 | Cohen |

(Continued)

OTHER PUBLICATIONS

Pulkkinen, S. "A Review of Methods for Unconstrained Optimization: Theory, Implementation and Testing," (Year: 2008).*

(Continued)

*Primary Examiner* — Tha-O H Bui
(74) *Attorney, Agent, or Firm* — Patterson & Sheridan, LLP; Steven H. Versteeg

(57) ABSTRACT

A controller utilizes dual sense bin balancing (DSBB) to adjust a read level between memory states of an array of NAND flash memory cells. One or more iterations of DSBB may be performed to provide a read level. Each iteration of the DSBB includes performing a first sense read, performing a second sense read, determining a read error, and adjusting the initial read level. The first sense read is performed at a first offset of an initial read level of memory cells. The second sense read is performed at a second offset of the initial read level of memory cells. A read error is determined from the first sense read and the second sense read. The read level is adjusted by the read error. A read of the randomized data pattern is conducted with the adjusted read level of a last iteration of the DSBB.

20 Claims, 12 Drawing Sheets

(56) References Cited

U.S. PATENT DOCUMENTS

2019/0102084 A1* 4/2019 Zhang ............... G11C 11/5642
2019/0354313 A1 11/2019 Sheperek et al.
2019/0391865 A1* 12/2019 Cadloni ............ G11C 11/5642
2020/0105353 A1* 4/2020 Sharon .................. G11C 16/28

OTHER PUBLICATIONS

Berahas et al. "A theoretical and empirical comparison of gradient approximations in derivative-free optimization," arXiv preprint arXiv:1905.01332, Dec. 31, 2019, pp. 3-4, 12.

International Search Report and the Written Opinion for International Application No. PCT/US2020/066898, dated Mar. 3, 2021, 17 pages.

Kelley, C.T. "Iterative methods for optimization," Society for Industrial and Applied Mathematics, 1999, Dec. 31, 1999, pp. 17, 39-52.

Pulkkinen, S. "A Review of Methods for Unconstrained Optimization: Theory, Implementation and Testing," 2008, available at <https://core.ac.uk/download/pdf/14916847.pdf>, Dec. 31, 2008, Chapter 2.3. Gradient Descent Methods, pp. 13-36; Appendix A.5 Finite-Difference, Approximations, pp. 98-99.

Wikipedia Contributors, (Jun. 18, 2020). Finite difference. In Wikipedia, The Free Encyclopedia. Retrieved 13:49, Mar. 1, 2021, from URL <https://en.wikipedia.org/w/index.php?title=Finite_difference&oldid=963179578>, Jun. 18, 2020 (Jun. 18, 2020), Ch. "Relation with derivatives".

* cited by examiner

502 — BASIC MODEL OF EXPECTED BIN CORRELATION $$C * \Delta\text{READ LEVELS} = \Delta\text{BIN COUNTS}$$

$$C = \begin{pmatrix}
1 & 0 & 0 & 0 & 0 & 0 & 0 & 0 & 0 & 0 & 0 & 0 & 0 & 0 & 0 \\
-1 & 1 & 0 & 0 & 0 & 0 & 0 & 0 & 0 & 0 & 0 & 0 & 0 & 0 & 0 \\
0 & -1 & 1 & 0 & 0 & 0 & 0 & 0 & 0 & 0 & 0 & 0 & 0 & 0 & 0 \\
0 & 0 & -1 & 1 & 0 & 0 & 0 & 0 & 0 & 0 & 0 & 0 & 0 & 0 & 0 \\
0 & 0 & 0 & -1 & 1 & 0 & 0 & 0 & 0 & 0 & 0 & 0 & 0 & 0 & 0 \\
0 & 0 & 0 & 0 & -1 & 1 & 0 & 0 & 0 & 0 & 0 & 0 & 0 & 0 & 0 \\
0 & 0 & 0 & 0 & 0 & -1 & 1 & 0 & 0 & 0 & 0 & 0 & 0 & 0 & 0 \\
0 & 0 & 0 & 0 & 0 & 0 & -1 & 1 & 0 & 0 & 0 & 0 & 0 & 0 & 0 \\
0 & 0 & 0 & 0 & 0 & 0 & 0 & -1 & 1 & 0 & 0 & 0 & 0 & 0 & 0 \\
0 & 0 & 0 & 0 & 0 & 0 & 0 & 0 & -1 & 1 & 0 & 0 & 0 & 0 & 0 \\
0 & 0 & 0 & 0 & 0 & 0 & 0 & 0 & 0 & -1 & 1 & 0 & 0 & 0 & 0 \\
0 & 0 & 0 & 0 & 0 & 0 & 0 & 0 & 0 & 0 & -1 & 1 & 0 & 0 & 0 \\
0 & 0 & 0 & 0 & 0 & 0 & 0 & 0 & 0 & 0 & 0 & -1 & 1 & 0 & 0 \\
0 & 0 & 0 & 0 & 0 & 0 & 0 & 0 & 0 & 0 & 0 & 0 & -1 & 1 & 0 \\
0 & 0 & 0 & 0 & 0 & 0 & 0 & 0 & 0 & 0 & 0 & 0 & 0 & -1 & 1 \\
0 & 0 & 0 & 0 & 0 & 0 & 0 & 0 & 0 & 0 & 0 & 0 & 0 & 0 & -1
\end{pmatrix}$$

504 — GRADIENT CALCULATION $$C^+ * \Delta\text{BIN COUNTS} = \Delta\text{READ LEVELS}$$

$$C^+ = \begin{pmatrix}
15 & -1 & -1 & -1 & -1 & -1 & -1 & -1 & -1 & -1 & -1 & -1 & -1 & -1 & -1 & -1 \\
14 & 14 & -2 & -2 & -2 & -2 & -2 & -2 & -2 & -2 & -2 & -2 & -2 & -2 & -2 & -2 \\
13 & 13 & 13 & -3 & -3 & -3 & -3 & -3 & -3 & -3 & -3 & -3 & -3 & -3 & -3 & -3 \\
12 & 12 & 12 & 12 & -4 & -4 & -4 & -4 & -4 & -4 & -4 & -4 & -4 & -4 & -4 & -4 \\
11 & 11 & 11 & 11 & 11 & -5 & -5 & -5 & -5 & -5 & -5 & -5 & -5 & -5 & -5 & -5 \\
10 & 10 & 10 & 10 & 10 & 10 & -6 & -6 & -6 & -6 & -6 & -6 & -6 & -6 & -6 & -6 \\
9 & 9 & 9 & 9 & 9 & 9 & 9 & -7 & -7 & -7 & -7 & -7 & -7 & -7 & -7 & -7 \\
8 & 8 & 8 & 8 & 8 & 8 & 8 & 8 & -8 & -8 & -8 & -8 & -8 & -8 & -8 & -8 \\
7 & 7 & 7 & 7 & 7 & 7 & 7 & 7 & 7 & -9 & -9 & -9 & -9 & -9 & -9 & -9 \\
6 & 6 & 6 & 6 & 6 & 6 & 6 & 6 & 6 & 6 & -10 & -10 & -10 & -10 & -10 & -10 \\
5 & 5 & 5 & 5 & 5 & 5 & 5 & 5 & 5 & 5 & 5 & -11 & -11 & -11 & -11 & -11 \\
4 & 4 & 4 & 4 & 4 & 4 & 4 & 4 & 4 & 4 & 4 & 4 & -12 & -12 & -12 & -12 \\
3 & 3 & 3 & 3 & 3 & 3 & 3 & 3 & 3 & 3 & 3 & 3 & 3 & -13 & -13 & -13 \\
2 & 2 & 2 & 2 & 2 & 2 & 2 & 2 & 2 & 2 & 2 & 2 & 2 & 2 & -14 & -14 \\
1 & 1 & 1 & 1 & 1 & 1 & 1 & 1 & 1 & 1 & 1 & 1 & 1 & 1 & 1 & -15
\end{pmatrix}$$

PSEUDO INVERSE IS $C^+ = (C^T C)^{-1} C^T$

FIG. 5A
(PRIOR ART)

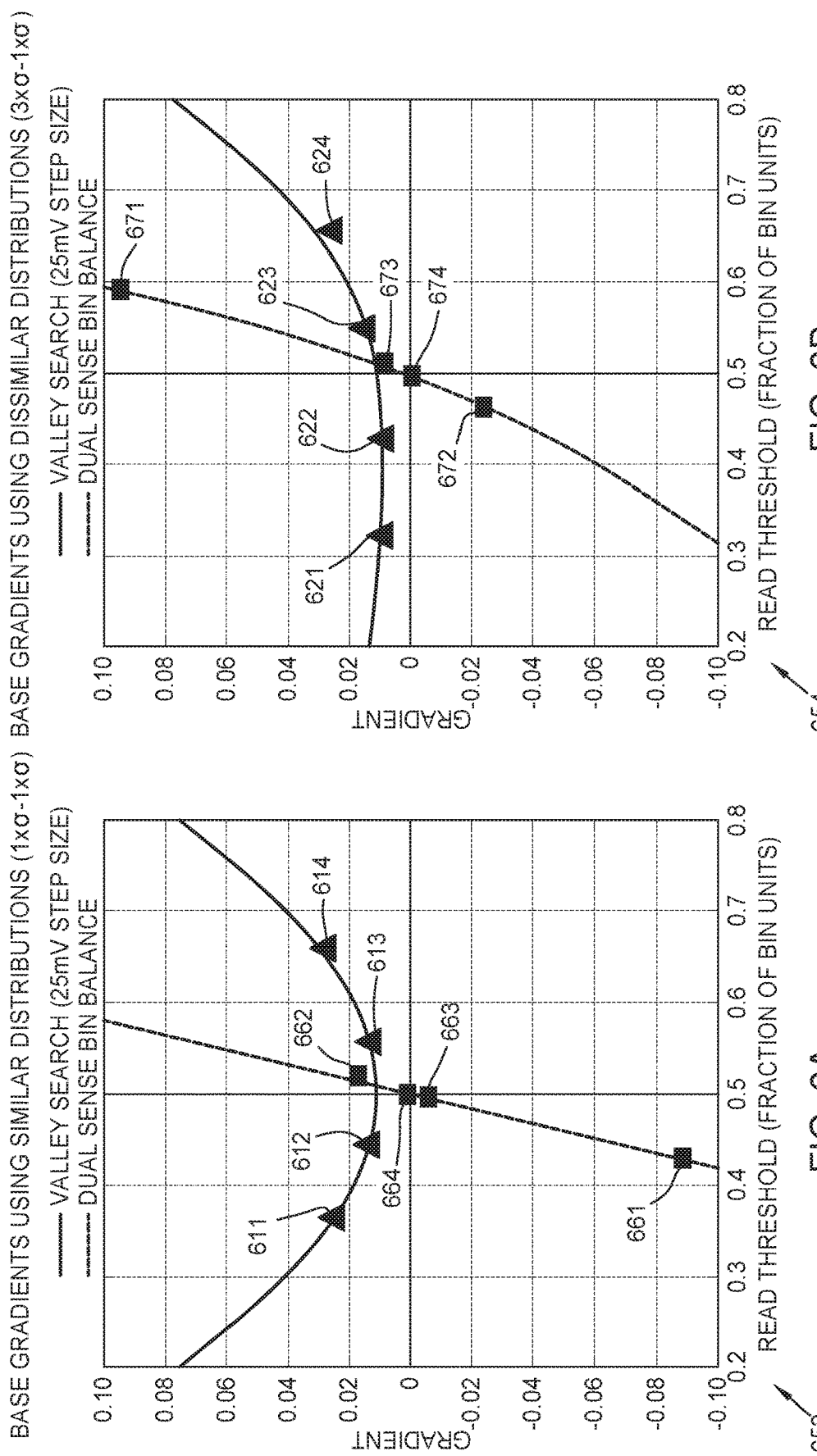

CALCULATE ERROR GRADIENT

| QLC WEIGHTING PARAMETERS FOR $RL_X$ ($M \approx 2^{16}$) | | |
|---|---|---|
| X | $C_X$ | $D_X$ |
| 1 | 15/16 | 1/16 |
| 2 | 14/16 | 2/16 |
| 3 | 13/16 | 3/16 |
| 4 | 12/16 | 4/16 |
| 5 | 11/16 | 5/16 |
| 6 | 10/16 | 6/16 |
| 7 | 9/16 | 7/16 |
| 8 | 8/16 | 8/16 |
| 9 | 7/16 | 9/16 |
| 10 | 6/16 | 10/16 |
| 11 | 5/16 | 11/16 |
| 12 | 4/16 | 12/16 |
| 13 | 3/16 | 13/16 |
| 14 | 2/16 | 14/16 |
| 15 | 1/16 | 15/16 |

DUAL SENSE BIN BALANCING IN NAND FLASH

BACKGROUND OF THE DISCLOSURE

Field of the Disclosure

Embodiments of the present disclosure generally relate to dual sense bin balancing to adjust a demarcation read threshold voltage level ("read level") between memory states of an array of NAND flash memory cells.

Description of the Related Art

A NAND flash memory cell is programmed by trapping electrons on a floating gate or a charge trapping layer to a cell threshold voltage corresponding to a desired program level. Data is read from an array of NAND flash memory cells by applying read levels to the flash memory cells to determine the program levels of the memory cells. Due to shifts and widening of the distributions of cell threshold voltages of the memory cells due to leakage of the floating gates/charge trapping layer and/or due to the differences of temperature at programming versus at reading, the read levels may inaccurately determine the memory states of the memory cells which may not be correctable by an error correction code process.

When the programmed data pattern is unknown and/or when the bit error rate is so high that the error correction code process alone does not result in decoding success, read levels of the memory cells are adjusted by existing methods to increase decoding success. Valley search ("VS") is one existing method of adjusting read levels when the programmed data pattern is unknown. VS adjusts a read level by performing a plurality of measurements utilizing incrementing senses over a defined set of read levels (i.e., sweep range) to find a minimum read error of a curved read error gradient of a valley between two distributions of memory states. However, VS may require a large number of senses, such as 8 or more sense, to determine a final adjusted read level. VS may not be able to accurately determine the ideal read level due to the shallow curved read error gradient. VS may find a "false minimum" in a neighboring valley between another adjacent memory state if an incorrect sweep range is used and/or if insufficient number of measurement locations is used. Other attempts have been made to improve VS by combining VS with a determination of the age of the data or wear-level of the NAND array or with a determination of the change in the error counts after an error correction code process. These other attempts require complicated hardware and/or software that may still inaccurately adjust read levels after a plurality of singe sense reads.

Therefore, there is a need for an improved method of adjusting a read level between memory states of an array of NAND flash memory cells.

SUMMARY OF THE DISCLOSURE

Embodiments of the present disclosure generally relate to dual sense bin balancing (DSBB) to adjust a read level between memory states of an array of NAND flash memory cells.

In one embodiment, a method of reading a randomized data pattern stored in an array of memory cells includes performing one or more iterations of a DSBB to provide a read level. Each iteration of the DSBB includes performing a first sense read, performing a second sense read, determining a read error, and adjusting the initial read level. The first sense read is performed at a first offset of an initial read level of memory cells to determine a first number of memory cells relative to the first offset. The second sense read is performed at a second offset of the initial read level of memory cells to determine a second number of memory cells relative to the second offset. A read error of the initial read level is determined from the first sense read and the second sense read. The initial read level is adjusted by the read error to provide an adjusted read level. A read of the randomized data pattern is conducted with the read level of the adjusted read level of a last iteration of the DSBB.

In one embodiment, a flash memory die includes an array of memory cells and a logic circuit. The array of memory cells is configured to store a randomized data pattern. The logic circuit is configured to perform one or more iterations of a DSBB to provide a read level. Each iteration of the DSBB includes performing a first sense read, performing a second sense read, determining a read error, and adjusting the initial read level. The first sense read is performed at a first offset of an initial read level of memory cells to determine a first number of memory cells relative to the first offset. The second sense read is performed at a second offset of the initial read level of memory cells to determine a second number of memory cells relative to the second offset. A read error of the initial read level is determined from the first sense read and the second sense read. The initial read level is adjusted by the read error to provide an adjusted read level.

In another embodiment, a method of reading a randomized data pattern stored in an array of memory cells includes performing a first plurality of iterations to provide a first read level and a second plurality of iterations to provide a second read level. Each iteration of the first plurality of iterations includes performing a first sense read, performing a second sense read, determining a read error, and adjusting the initial first read level. The first sense read is performed at a first offset of an initial first read level of memory cells to determine a first number of memory cells relative to the first offset. The second sense read is performed at a second offset of the initial read level of memory cells to determine a second number of memory cells relative to the second offset. A read error of the initial first read level is determined from the first sense read and the second sense read. The initial first read level is adjusted by the read error to provide an adjusted first read level. Each iteration of the second plurality of iterations includes performing a first sense read, performing a second sense read, determining a read error, and adjusting the initial second read level. The first sense read is performed at a first offset of an initial second read level of memory cells to determine a first number of memory cells relative to the first offset. The second sense read is performed at a second offset of the initial second read level of memory cells to determine a second number of memory cells relative to the second offset. A read error of the initial second read level is determined from the first sense read and the second sense read. The initial second read level is adjusted by the read error to provide an adjusted second read level. A read of the randomized data pattern is conducted with the adjusted first read level of a last iteration of the first plurality of iterations and with the adjusted second read level of a last iteration of the second plurality of iterations.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5A shows a gradient generator matrix converting bin counts to changes in read levels.

FIG. 6A is a schematic chart illustrating a comparison of the prior art VS and certain embodiments of DSBB for adjusting a read level between two similar distribution curves of cell threshold voltages of two memory states.

FIG. 6B is a schematic chart illustrating a comparison of the prior art VS and certain embodiments of DSBB for adjusting a read level between two dissimilar distribution curves of cell threshold voltages of two memory states.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s). Usage in the Summary of the Disclosure or in the Detailed Description of the term "comprising" shall mean comprising, consisting essentially, and/or consisting of.

Embodiments of the present disclosure generally relate to one or more iterations of dual sense bin balancing ("DSBB") to determine a demarcation read threshold voltage level ("read level") between two memory states of an array of NAND flash memory cells. DSBB is implemented in hardware, software, or a combination thereof. In certain embodiments, DSBB is implemented as a logic circuit of a NAND flash die containing the array of NAND flash memory cells.

DSBB adjusts a read level to increase the probability of read success of a randomized data pattern stored in an array of NAND flash memory cells. Instead of a plurality of measurements utilizing incrementing senses of VS, DSBB comprises performing a dual sense read at a first offset and at a second offset from an initial read level. The results of the dual sense read generate a read error to adjust the read level. In certain embodiments, the one or more iterations of DSBB forms a substantially linear read error gradient converging near or at the ideal read level.

In certain embodiments, DSBB adjusts a read level between two memory states with increased accuracy. In certain embodiments, DSBB determines a read level with reduced latency. In certain embodiments, DSBB is performed in an error recovery mode in conjunction with or without a storage/host controller with error correction code processing capability. In certain embodiments, DSBB is performed by a logic circuit of the NAND flash die containing the array of NAND flash memory cells. In certain aspects when DSBB is implemented by a logic circuit of the NAND flash die, multiple NAND flash dies perform DSBB in parallel without adding traffic to the interface between the NAND flash die and the storage/host controller.

Figure 1:
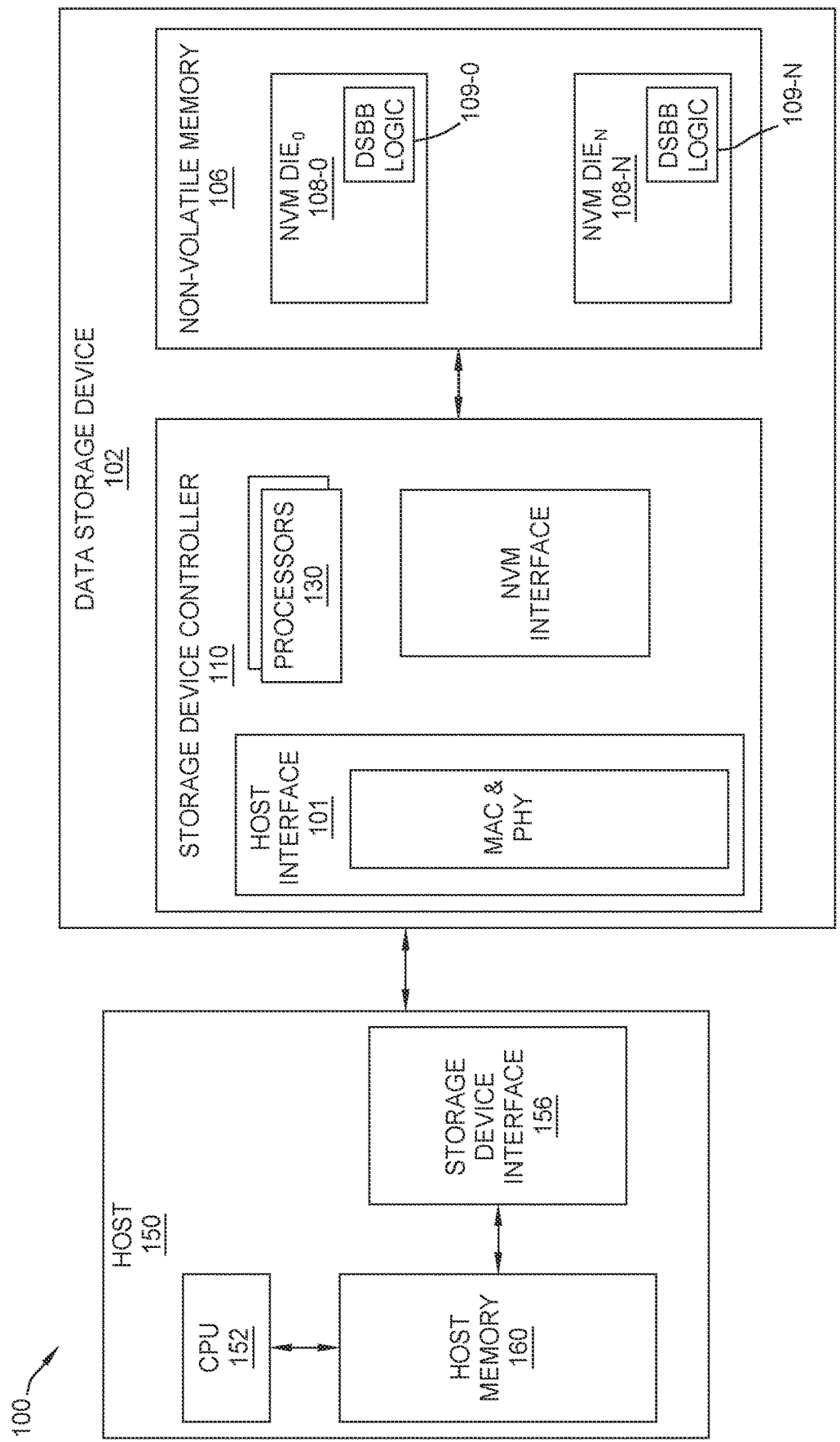
FIG. 1 is a schematic block diagram illustrating certain embodiments of a computer system including a host connected to a data storage device.

FIG. 1 is a schematic block diagram illustrating certain embodiments of a computer system 100 including a host 150 connected to a data storage device 102, such as a solid state drive (SSD). Host 150 utilizes a non-volatile memory (NVM) 106, such as NAND flash memory, included in data storage device 102 to write and to read data, such as for long term memory storage.

Host 150 can be a hardware platform including one or more central processing units (CPUs) 152, host memory space 160, and a storage device interface 156. Host 150 may include a wide range of devices, such as computer servers, network attached storage (NAS) units, desktop computers, notebook (e.g., laptops) computers, tablet computers (e.g., "smart" pads), mobile devices, set-top boxes, telephone handsets (e.g., "smart" phones), televisions, cameras, display devices, digital media players, video gaming consoles, video streaming devices, and automotive applications (e.g., mapping, autonomous driving). In certain embodiments, host 150 includes any device having a processing unit or any form of hardware capable of processing data, including a general purpose processing unit, dedicated hardware (such as an application specific integrated circuit (ASIC)), configurable hardware such as a field programmable gate array (FPGA), or any other form of processing unit configured by software instructions, microcode, or firmware.

Host memory space 160 is a device allowing information, such as executable instructions, cryptographic keys, configurations, and other data, to be stored and retrieved. Host memory space 160 can be DRAM, SRAM, other main memories, and combinations thereof. An application program may be stored to host memory space 160 for execution by components of host 150.

Host 150 can be connected to the storage device 102 over a data center storage system network, an enterprise storage system network, a storage area network, a cloud storage network, a local area network (LAN), a wide area network (WAN), the Internet, other networks, wired links, wireless links, and interconnections thereof.

In certain embodiments, the storage device interface 156 can be a network interface. Network interface enables host 150 to communicate with data storage device 102 via a communication medium, such as a network coupling host 150 and data storage device 102 within the computing system 100. Network interface may be one or more network adapters, also referred to as Network Interface Cards (NICs). In certain embodiments, the storage device interface 156 can be a dedicated link between host 150 and data storage device 102. The storage device interface 156 of host 150 interacts with a host interface 101 of the data storage device 102 for ingress and egress of communications between host 150 and data storage device 102. Storage device interface 156 and host interface 101 operate under a communication protocol, such as a Peripheral Component Interface Express (PCIe) serial communication protocol, Universal Flash Storage (UFS), a serial advanced technology attachment (SATA), serial attached SCSI (SAS), or other suitable communication protocols.

Data storage device 102 may be a network storage device, an internal storage drive (e.g., server computer, desktop hard drive, notebook computer), a data center storage device, an external storage device, an embedded mass storage device, a removable mass storage device, and other suitable data storage devices.

Data storage device 102 includes a storage device controller 110 which manages operations of storage device 102, such as writes to and reads from NVM 106. Storage device controller 110 may include one or more processors 130, which may be multi-core processors. Processor 130 handles the components of data storage device 102 through firmware and/or software. Processor 130 executes instructions of the computer-readable program code of the firmware and/or software. Storage controller 110 implements the processes described herein by execution of instructions by the processor 130, by hardware, or by combinations thereof. Hardware can include various components of storage device controller 110, such as logic gates, switches, application specific integrated circuits (ASICs), programmable logic controllers, embedded microcontrollers, registers, and other components.

NVM 106 of storage device 102 may be configured for long-term storage of information as non-volatile memory space and retains information after power on/off cycles. NVM 106 comprises a plurality of NAND flash dies 108 of NAND flash memory arrays. The flash memory arrays are single-level memory cells (SLC), multiple-level memory cells (MLC), triple-level memory cells (TLC), quad-level memory cells (QLC), or other level memory cell technologies now known, in development, or later developed, such as five-level cell memory cells. The NAND flash memory arrays are fabricated in a two-dimensional or three-dimensional architecture. In other embodiments, NVM 106 may be other non-volatile memories comprising a cell configured to store multiple bits of memory.

In certain embodiments, the DSBB logic circuit 109 may be activated in an error recovery mode, such as due to drift of the cell voltages of NAND memory cells due to time, heat, and/or cell threshold voltage leakage. In certain embodiments, a DSBB logic circuit 109 is included with each NAND flash die 108 in which the DSBB logic circuit 109 adjusts one or more read levels to resolve the memory states of a plurality (e.g., page or other unit) of the memory cells of the NAND flash memory array. The DSBB logic circuit 109 included with the NAND flash die 108 may be manufactured within the NAND flash die 108 or may be coupled to the NAND flash die (e.g., 3D chip stacking, circuit bonded array). Since a DSBB logic circuit 109 is included with each NAND flash die 108, a plurality of DSBB logic circuit 109 can be operated in parallel to provide adjusted read levels without the storage device controller 110 as a bottleneck performing DSBB for all of the NAND flash dies 108. In certain embodiments, a DSBB logic circuit 109 of a NAND flash die 108 is used without a storage device controller 110. In other embodiments, the storage device controller 110 comprises DSBB logic implemented in software, hardware, or a combination thereof.

FIGS. 2A-D_are schematic diagrams illustrating certain embodiments of distributions of programmed threshold voltages of an array of memory cells, such as NAND flash memory cells making up the NVM die 108 of FIG. 1 or other NVM. The memory cells are configured to be programmed to at least two memory states under any suitable gray coding scheme. Programmed data to the memory cells is typically randomized, such as by a pseudorandom scrambler, so that each of the possible values of the memory states is approximately uniform across the memory cells.

Figure 2:
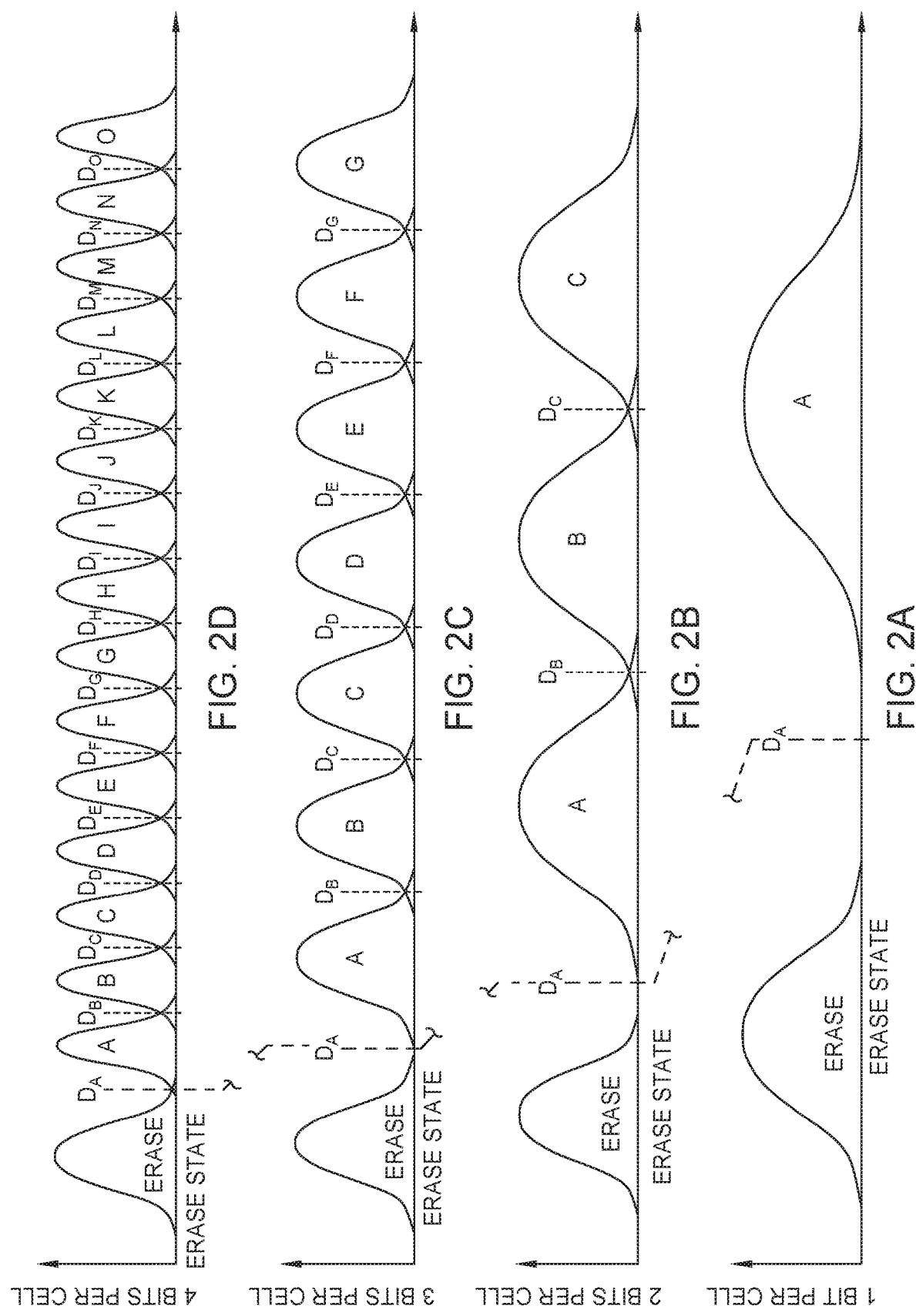
FIGS. 2A-D are schematic diagrams illustrating certain embodiments of distributions of programmed threshold voltages of an array of memory cells.

As shown in FIG. 2A, single-level cells (SLC) stores one bit per cell with two memory states demarcated by one read level ($D_A$). As shown in FIG. 2B, multiple-level cells (MLC) or X2 cells store two bits per cell with four memory states. The four memory states are demarcated by three read levels ($D_A$, $D_B$, $D_C$). As shown in FIG. 2C, triple-level cells (TLC) or X3 cells store three bits per cell with eight memory states. The eight memory states are demarcated by seven read levels ($D_A$, $D_B$, $D_C$, $D_D$, $D_E$, $D_F$, $D_G$). As shown in FIG. 2D, quad-level cells (QLC) or X4 cells store four bits per cell with sixteen memory states. The sixteen memory states are demarcated by fifteen read levels ($D_A$, $D_B$, $D_C$, $D_D$, $D_E$, $D_F$, $D_G$, $D_H$, $D_I$, $D_J$, $D_K$, $D_L$, $D_M$, $D_N$, $D_O$).

Reads of the cell threshold voltages of the memory cells determine the memory states of the memory cells by determining which cells have a threshold voltage above/below each of the read levels. Ideal read levels are at the intersections of the distribution curves with similar or dissimilar curvatures with similar or dissimilar cumulative areas of programmed cell threshold voltage levels. For example, an ideal read level $D_B$ is at the intersection of the threshold voltage distribution of memory cells at memory state A and of the threshold voltage distribution of memory cells at memory state B.

Figure 3:
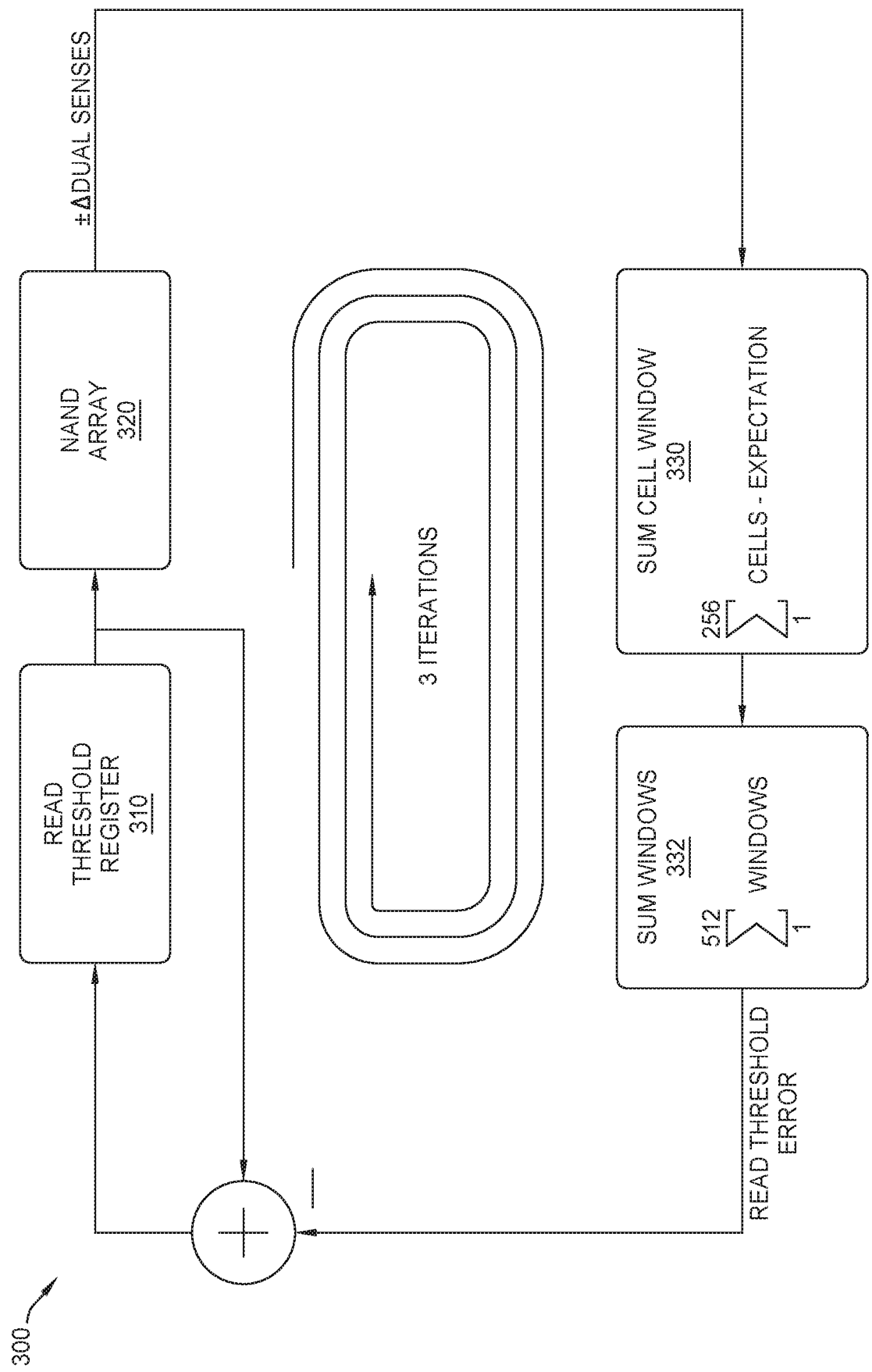
FIG. 3 is a schematic diagram of certain embodiments of a dual sense read loop for adjusting one or more read levels by DSBB of an array of memory cells.

FIG. 3 is a schematic diagram of certain embodiments of a dual sense read loop 300 for adjusting one or more read levels by DSBB of an array of memory cells, such as the memory cells illustrated in FIGS. 2A-D or other suitable memory cells. As shown, the dual sense read loop 300 is included with the NVM die 108 of FIG. 1 or other suitable dies or contained within the storage device controller 110 of FIG. 1 or other suitable controllers. The dual sense read loop 300 is activated in error recover mode, in a mode when the NVM die 108 is not coupled to a controller, or in other modes to adjust one or more read levels.

The dual sense read loop 300 includes a read threshold register 310. The read threshold register 310, such as a first accumulator, stores a read level which is updated once per iteration of the dual sense read loop 300. A dual sense read loop 300 includes a first sense read at a first offset and a second sense read at a second offset to an initial read level stored in the threshold register 310. A dual sense read is conducted of a NAND array 320 of memory cells of the NVM die 108. The first sense read and a second sense read are separated by a plurality of DAC code steps. In one example configuration for a NAND array of QLC memory cells with an approximate bin width of about 400 mV with each DAC step set to 12.5 mV, a dual sense read is conducted at a first offset of +8 DAC steps (corresponding to a +0.25 nominal bin width) and a second offset of −8 DAC steps (corresponding to a −0.25 approximate bin width) from the initial read level.

A first summing block 330, such as a second accumulator, accumulates the sense results from the dual sense read of a plurality of memory cells, such as 256 memory cells or any summing window of an appropriate number of memory cells, and subtracts a local expectation to obtain a partial read error. A second summing block 332, such as a third accumulator, accumulates the partial read error, such as 512 summing windows or any appropriate number of summing windows, to provide a full read error for a full number of memory cells of a wordline. The read threshold register 310 is updated by subtracting out the full read threshold error from the initial read level and becoming an adjusted read level. In a successive iteration of the dual sense read loop 300, the adjusted read level stored in the read threshold register 310 is used as the initial read level in the successive performance of the dual sense read loop 300 to result in a successive adjusted read level. For example, the first adjusted read level from the first iteration of the dual sense read is used as the second initial read level in a second iteration of the dual sense read. For example, the second adjusted read level from the second iteration of the dual sense read is used as the third initial read level in a third iteration of the dual sense read.

One or more iterations of the dual sense read loop 300 are performed to determine a read level. A read of the scrambled data is performed utilizing the last adjusted read level of the last iteration of the dual sense read loop 300. Converging to the read level can be determined by any number of iterations. For example, in certain embodiment, a single iteration of the dual sense read loop is used when the read level is adjusted by a small amount. For example, in certain embodiment, three iterations of the dual sense read loop is used when the read level is adjusted by a large amount. Converging to the read level in one or more iterations of the dual sense read loop 300 results in a lower failed bit count (FBC) over code word in comparison to multiple senses of a VS. In certain embodiments, converging to the read level in one or more iterations of the dual sense read loop 300 utilizes less total sense reads in comparison to multiple senses of a VS.

The dual sense read loop 300 can determine a single read levels or a plurality of read levels for a page of memory cells. For example, the dual sense read loop 300 can determine a plurality of read levels associated with a certain bit information stored by the plurality of memory cells, such as a bit of SLC memory cells, such as an upper or lower bit of MLC memory cells, such as an upper, middle, or lower bit of TLC cells, or such as top, upper, middle, or lower bit of QLC memory cells. For example, the dual sense read loop 300 can determine all of read levels of the possible memory states, such as one read level for SLC memory cells, three read levels for MLC memory cells, such as seven read levels for TLC cells, or such as fifteen read levels for QLC memory cells.

Figure 4A:
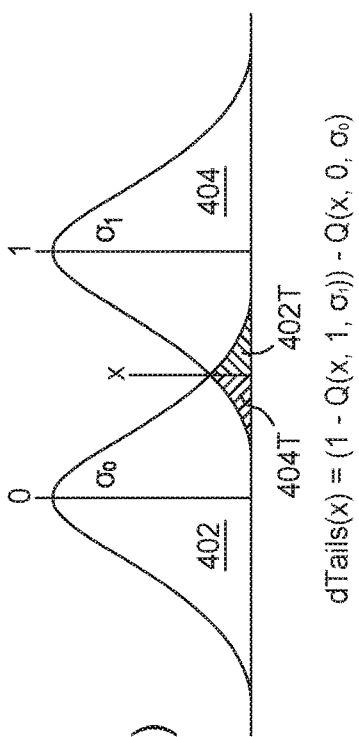
FIG. 4A is a diagram illustrating a sense operation without knowing the data pattern expressed as a difference of error tails.

FIG. 4A is a diagram illustrating a sense operation without knowing the data pattern expressed as a difference of error tails.

A scrambler providing randomized data to a group of memory cells, such as a page of memory cells, results in the memory cells have a substantially uniform number of memory cells in each memory state. For example, an array of SLC memory cells has two substantially uniform memory states, an array of MLC memory cells has four substantially uniform memory states, an array of TLC memory cells has eight substantially uniform memory states, and an array of QLC memory cells has sixteen substantially uniform memory states. VS changes read levels in a plurality of measurements of incrementing senses to determine the read levels which results in the most balanced bins of each of these memory states.

Since the data is randomized, the number of memory cells in memory state 402 should be approximately the same as the number of memory cells in memory state 404. Similarly since the data is randomized and the curvature of the threshold voltage distributions are similar, the number of memory cells in the tail 402T of the distribution of memory state 402 and the number of memory cells in the tail 404T of distribution of memory state 404 should be approximately the same at the ideal read level. The ideal read level is at the local minimum or valley between the distributions of the two memory states 402, 404.

The sense operation using a read level (x). Although each tail alone cannot be sensed, the difference in tails 402T, 404T can be sensed following Equation 1.

$$d\text{Tails}(x) = (1 - Q(x, 1, \sigma_1)) - Q(x, 0, v_0) \qquad (1)$$

FIG. 5A shows matrices of how bin counts of each memory states are related to changes in read levels. Matrices can be constructed for any number of bin levels. SLC memory cells (1 bit/cell) have two bin levels. MLC memory cells (2 bit/cell) have four bin levels. TLC memory cells (3 bits/cell) have 8 bin levels. QLC memory cells (4 bits/cell) have 16 bin levels.

Matrix 502 shows how the bin counts of the number of memory cells at each memory state change with changes in the read level demarcating each of the memory states of the QLC memory cells. The bin counts or population at each memory state of the QLC memory cells should be approximately the same at the ideal read levels. For example, for QLC memory cells, there are sixteen bins with the bin count ($BC_0$) as the number of memory cells in memory state Erased, with $BC_1$ as the number of memory cells in memory state A, with the $BC_2$ as the number of memory cells in memory state B, with the $BC_3$ as the number of memory cells in memory state C, with the $BC_4$ as the number of memory cells in memory state D, with the $BC_5$ as the number of memory cells in memory state E, with the $BC_6$ as the number of memory cells in memory state F, with the $BC_7$ as the number of memory cells in memory state G, with the $BC_8$ as the number of memory cells in memory state H, with the $BC_9$ as the number of memory cells in memory state I, with the $BC_{10}$ as the number of memory cells in memory state J, with the $BC_{11}$ as the number of memory cells in memory state K, with the $BC_{12}$ as the number of memory cells in memory state L, with the $BC_{13}$ as the number of memory cells in memory state M, with the $BC_{14}$ as the number of memory cells in memory state N, and with the $BC_{15}$ as the number of memory cells in memory state O for certain read levels.

Matrix 504 is the pseudo inverse of matrix 502 showing how the read levels at each memory state change with a certain bin count for each memory state. The measured bin counts are used with matrix 504 to generate read errors to adjust the read levels.

Figure 4B:
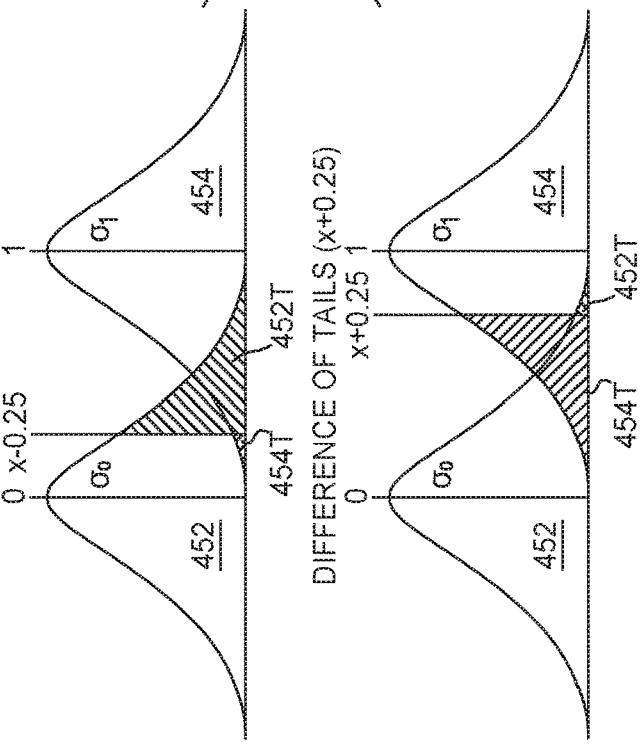
FIG. 4B is a diagram showing certain embodiments of dual sense bin balancing to adjust a read level between cell threshold voltage distributions with similar curvature of two memory states of memory cells storing randomized data.

FIG. 4B is a diagram showing certain embodiments of dual sense bin balancing ("DSBB") to determine a read level between cell threshold voltage distributions with similar curvature of two memory states 452, 454 of memory cells storing randomized data.

DSBB comprises a dual sense read to determine a read level instead of a plurality of measurement utilizing incrementing senses of VS. In certain aspects, one or more iterations of DSBB provides a read level with higher accuracy than a plurality of measurements utilizing incrementing senses of VS. In certain aspects, one or more iterations of DSBB converges to a read level in a less number of total sense reads in comparison to a plurality of measurements utilizing incrementing senses of VS. In certain aspects, DSBB provides an adjusted read level at an unfixed location in comparison to VS with provides an adjusted read level at a fixed location. In certain aspects, DSBB can be initiated at any initial read level whereas in VS an accurate sweep range is required.

The ideal read level is at the local minimum or valley between the distributions of the two memory states 452, 454. DSBB comprises a first sense read at a first offset of an initial read level and a second sense read at a second offset of an initial read level. For example, the first offset is a negative offset from a target read level and the second offset is a positive offset from the target read level. For example, as shown in FIG. 4B, the first sense read is at the initial read level (x) with a negative offset of −0.25 nominal bin width and the second sense read is at the initial read level (x) with a positive offset of +0.25 nominal bin width. In other embodiments, any appropriate value of the offset can be used.

The difference in the tails 452T, 454T from the first sense read is determined according to equation (2).

$$dTL(x)=(1-Q(x-0.25,1,\sigma_1))-Q(x-0.25,0,\sigma_0) \quad (2)$$

The difference in the tails 452T, 454T from the second sense read is determined according to equation (3).

$$dTR(x)=(1-Q(x+0.25,1,\sigma_1))-Q(x+0.25,0,\sigma_0) \quad (3)$$

The read error is determined according to equation (4) which is the sum of the two senses.

$$\text{Read Error}=dTL(x)+dTR(x) \quad (4)$$

Figure 5B:
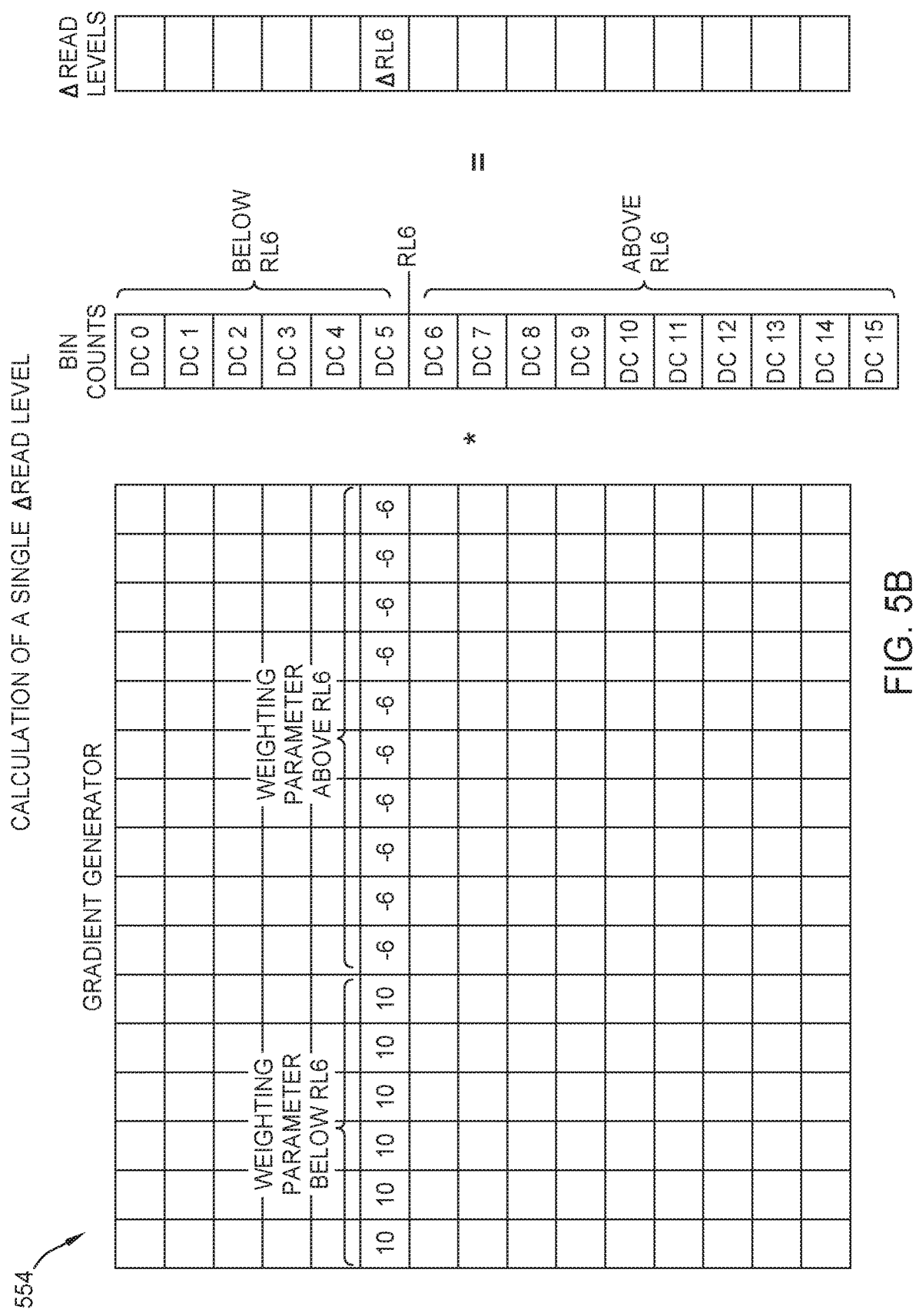
FIG. 5B shows a gradient generator matrix to generate a read error for a single read level in certain embodiments of DSBB.

FIG. 5B shows a gradient generator matrix to generate a read error for a single read level in certain embodiments of DSBB. Matrix 554 is based upon matrix 504. However, instead of counting the bin counts at each separate memory states, the number of memory states relative to a read level are counted. For example, as shown in FIG. 5B, the number of memory cells below Read Level-6 (RL6) and/or the number of memory cells above RD6 are counted. For example, in certain embodiments, the total number of cells below RL6 multiplied by a weighting parameter from the gradient generator of 10 is added with the total number of cells above RL6 multiplied by a weight parameter of −6 to determine a read error of one of the read senses of the dual sense reads. In other embodiments, just the number of memory cells below or above the read level is counted. For example, in certain embodiments, the total number of memory cells below the read level from a first sense read and the total number of memory cells below the read level from a second sense read are added together and then subtracted by an expectation value to determine a read error from both read senses.

FIG. 6A is a schematic chart 652 illustrating a comparison of the prior art VS and certain embodiments of DSBB for adjusting a read level between two similar distribution curves of cell threshold voltages of two memory states. FIG. 6B is a schematic chart 654 illustrating a comparison of the prior art VS and certain embodiments of DSBB for adjusting a read level between two dissimilar distribution curves of cell threshold voltages of two memory states. In FIG. 6A, the number of memory cells in two states are substantially equal and the distribution curves of each state are similar. In FIG. 6B, the number of memory cells in two states are substantially equal and the distribution curves of each state are dissimilar. In FIGS. 6A-B, an ideal read level is at a read threshold of 0.5 fraction of bin units.

In VS, a plurality of measurements utilizing incrementing senses are conducted to determine a last adjusted read level. For example, in FIG. 6A, four measurements 611, 612, 613, 614 are performed in a sweep of read levels at four fixed locations. VS produces a curved read error gradient in which the sense read with the lowest read error value is used as the final adjusted read level. It may be difficult to determine the bottom of a shallow curved read error gradient. For example, the measurements 612, 613 have similar low read errors and are inaccurately used as the last adjusted read level in VS. In VS, if an incorrect sweep range is used, the last adjusted read level could incorrectly be in a neighboring valley of an adjacent memory state. Subtraction of adjacent senses can provide an error gradient to indicate the location of the bottom of the valley. However, such an indication of the bottom of the valley could incorrectly be a neighboring valley of an adjacent memory state.

In DSBB, a plurality of iterations of dual sense reads are conducted to determine a last adjusted read level. For example, in FIG. 6A, a first DSBB iteration of a dual sense read at a first and second offset (e.g., ±offset) to a first initial read level 661 is performed. DSBB produces a substantially linear read error gradient in which the iterations of DSBB converges the read levels to lower and lower read errors. For example, the first initial read level 661 provides a large read error adjusting the read level to a first adjusted read level 662. A second DSBB iteration of a dual sense read at a first and second offset to a second initial read level 662 adjusted by the first DSBB iteration is performed. The second initial read level 662 provides a read error adjusting the read level to a second adjusted read level 663. A third DSBB iteration of a dual sense read at a first and second offset to a third initial read level 663 adjusted by the second DSBB iteration is performed. The third initial read level 663 provides a read error adjusting the read level to a third adjusted read level 664. Due to the linear nature of the read error gradient of DSBB, a plurality of iterations of DSBB quickly converges to a read level at an unfixed location near or at the ideal read level. In DSBB, even if an initial read level is in a neighboring valley of an adjacent memory state, DSBB will produce a very large read error adjusting the read level towards the ideal read level.

In VS, a plurality of measurements of incrementing senses are conducted to determine a last adjusted read level may be even more problematic for dissimilar distribution curves of two memory states. For example, in FIG. 6B, four measurements 621, 622, 623, and 624 are performed in a sweep of read levels at four fixed locations. Measurement 622 with the lowest read error is inaccurately used as the last adjusted read level in VS although measurement 623 is closer to the ideal read level but has a higher read error.

DSBB is able to accurately converge to an adjusted read level near or at the ideal read level for either similar distribution curves (e.g., FIG. 6A) or dissimilar distribution curves (e.g., FIG. 6B) of two memory states. For example, in FIG. 6B, a first DSBB iteration of a dual sense read at a first and second offset (e.g., ±offset) to an initial read level 671 is performed. DSBB produces a substantially linear read error gradient in which the iterations of DSBB converges the read levels to lower and lower read errors. For example, the first initial read level 671 provides a large read error adjusting the read level to a first adjusted read level 672. A second DSBB iteration of a dual sense read at a first and second offset to a second initial read level 672 adjusted by the first DSBB iteration is performed. The second initial read level 672 provides a read error adjusting the read level to a second adjusted read level 673. A third DSBB iteration of a dual sense read at a first and second offset to a third initial read level 673 adjusted by the second DSBB iteration is performed. The third initial read level 673 provides a read error adjusting the read level to a third adjusted read level 674. Due to the linear nature of the read error gradient of DSBB, a plurality of iterations of DSBB quickly converges to a read level at an unfixed location near or at the ideal read level. In DSBB, even if the distribution curves of the memory states are dissimilar, DSBB will converge the read level near or at the ideal read level.

In VS, for dissimilar distribution curves of memory states (e.g., FIG. 6B), the lowest error level may not be accurately near the ideal read level at a read threshold of 0.5 fraction of bin units. In DSBB, for similar distribution curves (e.g., FIG. 6A) or dissimilar distribution curves (e.g., FIG. 6B) of memory states, the read error gradient is substantially linear and converges to a read error of zero near or at the ideal read level at a read threshold of 0.5 fraction of bin units. In certain embodiments, DSBB produces a substantially linear error gradient which is not affected by signal noise. In certain embodiments, DSBB produces a substantially linear error gradient with a high slope.

Figure 7:
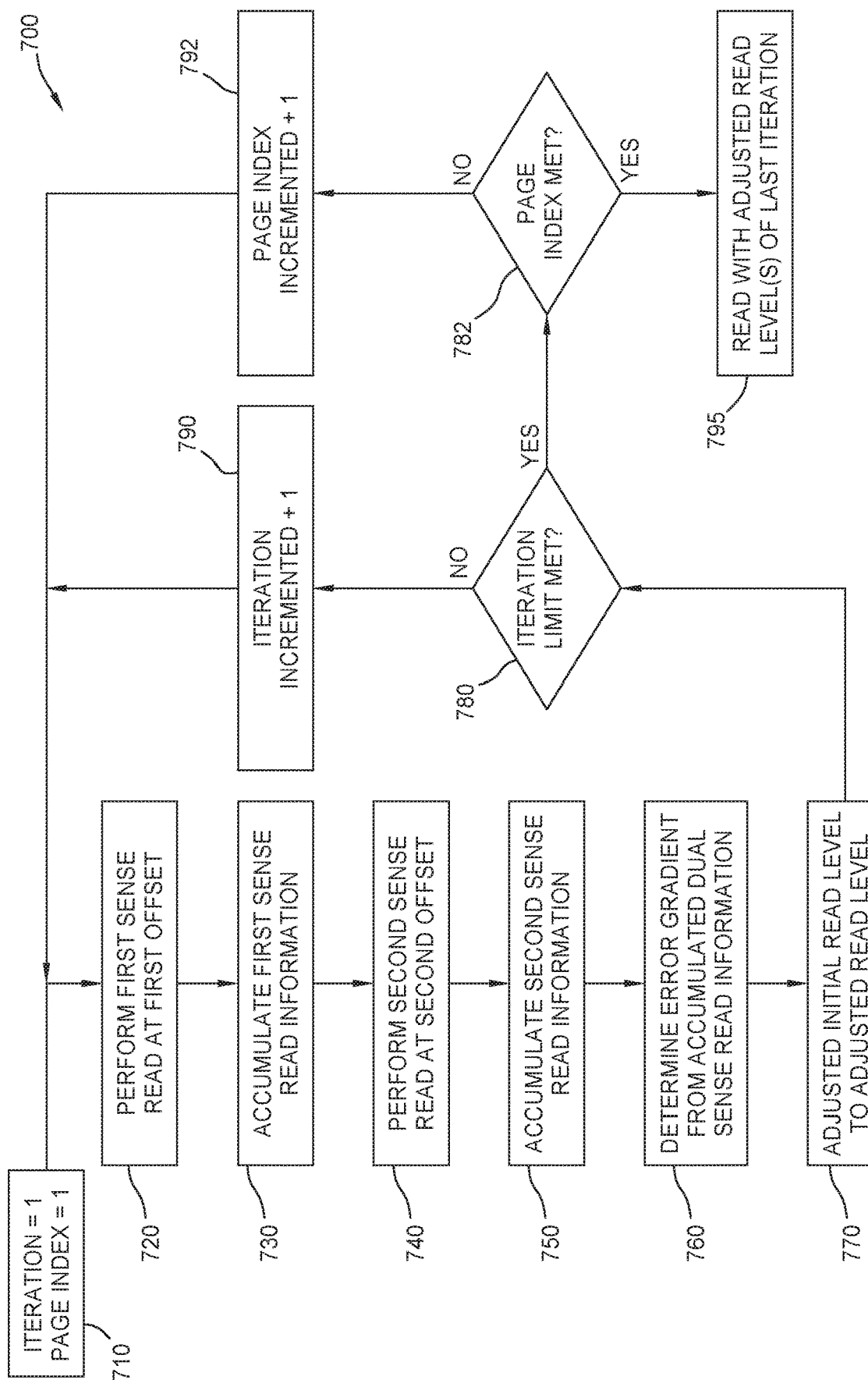
FIG. 7 is a flowchart illustrating certain embodiments of a method of DSBB determination of a read level of a single page or multiples page of an array of memory cells.

FIG. 7 is a flowchart illustrating certain embodiments of a process 700 of DSBB determination of a read level of a single page or multiples page of an array of memory cells. The process 700 is implemented in hardware, software, or both. In certain embodiments, the process 700 is implanted as a logic circuit of a NAND flash die containing the array of memory cells.

At block 710, a state machine provides an initial state of iteration=1 to signify a first iteration of the DSBB to determine a read level. The state machine provides an index=1 to signify a read level of a first page of an array of memory cells.

At block 720, a first sense read is performed at a first offset to an initial read level, such as at a negative offset to an initial read level. For example, the first sense read is negative eight DAC codes offset from the initial read level although any appropriate offset can be used. For example, the sense read is over 16 kBytes of a wordline of a page of NAND memory cells.

At block 730, the number of memory cells relative to the first offset of the initial read level from the first sense read from block 720 is accumulated in an accumulator. The number of memory cells relative to the first offset can be below and/or above the first offset of the initial read level.

At block 740, a second sense read is performed at a second offset to the initial read level, such as at a positive offset to an initial read level. For example, as shown the second sense read is positive eight DAC codes offset from the initial read level although any appropriate offset can be used.

At block 750, the number of memory cells relative to the second offset of the initial read level from the second sense read from block 750 is accumulated in an accumulator. The number of memory cells relative to the second offset can be below and/or above the second offset of the initial read level. The sense information of the dual sense read of blocks 720, 740 can be accumulated in blocks 730, 750 in any appropriately sized accumulator.

At block 760, a read error is determined from sense read information accumulated from blocks 730 and 750. In certain embodiments, the read error is determined by multiplication of weight factors to the sense read information of the dual sense read. In certain embodiments, the read error is determined by subtracting an expectation value from the added sense read information of the dual sense read.

At block 770, the read threshold is adjusted pursuant to the read error determined from block 760. For example, the read error is subtracted from the initial read level to provide an adjusted read level.

At block 780, whether the number of iterations of DSBB has met the iteration limit is met. For example, the iteration limit can be set to any suitable number. For example, in certain embodiments, the iteration limit is set to 3.

When the iteration limit is not met, the process 700 proceeds to block 790. At block 790, the process 700 increments the number of iterations by +1. The process 700 continues back to perform blocks 720, 730, 740, 750, 760, 770. The adjusted read level from a previous iteration of DSBB is used as the initial read level for the successive iteration of dual sense reads of block 720, 740. For example, initial read level$_{(iteration+1)}$=initial read level$_{(iteration)}$−error level$_{(iteration)}$.

When the iteration limit is met, the process proceeds to block 782. At block 782, the process 700 determines if the index limit is met. For example, the index limit can be set to 1 for a single page or can be set to greater than 1 for multiples pages. At block 792, the process 700 increments the number of index by =1. The process 700 continues back to blocks perform blocks 720, 730, 740, 750, 760, 770 for the number of increments for that page of memory cells.

When the index limit is met, the process proceeds to block 795. At block 795, the last adjusted read level(s) of the last iteration for the page(s) of memories cells are used to read the data from the NAND flash die.

Figure 8:
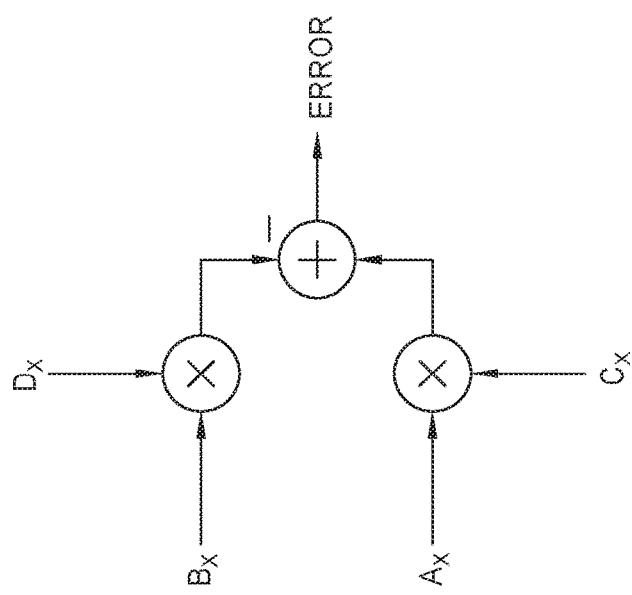
FIG. 8 is a schematic diagram of certain embodiments of a combinational logic implementing the method of FIG. 7.

FIG. 8 is a schematic diagram of certain embodiments of a combinational logic 800 implementing the process 700 of FIG. 7.

A first sense read with a first offset of a DSBB determines the number of memory cells below the first sense read is $B_x$ and the number of memory cells above the first sense read is $A_x$ for a read level$_x$. $B_x$ multiplied by the weight parameter $D_x$ is subtracted from $A_x$ multiplied by the weight parameter $C_x$ to produce a read error for the first sense read.

A second sense read with a second offset of a DSBB determines the number of memory cells below the first sense read is $B_x$ and the number of memory cells above the first sense read is $A_x$ for a read level$_x$. $B_x$ multiplied by the weight parameter $D_x$ is subtracted from $A_x$ multiplied by the weight parameter $C_x$ to produce a read error for the second sense read.

The read error from the first sense read is added with the read error from the second sense read to provide a read error to adjust the initial read level.

Figure 9:
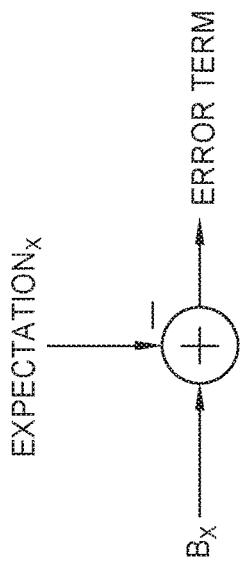
FIG. 9 is a schematic diagram of certain embodiments of a simplified combinational logic implementing the method of FIG. 7.

FIG. 9 is a schematic diagram of certain embodiments of a combinational logic 900 implementing the process 700 of FIG. 7.

A first sense read at a first offset of a DSBB determines a number of memory cells below the first sense read is $B_{x1}$. A second sense read at a second offset of a DSBB determines a number of memory cells below the second sense read is B. Accumulator adds $B_{x1}$ and $B_{x2}$ which is subtracted by an expectation value (Exp) which produces a read error from both the first sense read and the second sense read. Each read level has an expectation value of the number of memory cells below the dual sense read when the two bins are balanced. By subtracting the expectation value from the added dual read senses, multiplication of weight parameters is avoided.

In other embodiments, instead of adding the count of memory cells below the first sense read and the second sense read, the count of memory cells above the first sense read and the second sense read are added together and then subtracted by an expectation value (not shown in FIG. 9) to produce a read error from both the first sense read and the second sense read. Each read level has an expectation value of the number of memory cells above the dual sense read when the two bins are balanced.

The combinational logic 800, 900 of FIG. 8 or FIG. 9 may further include fine scaling and/or rounding components to provide the adjusted read levels.

DSBB adjusts a read level to increase the probability of read success of a randomized data pattern stored in an array of NAND flash memory cells. DSBB comprises performing a dual sense read at a first offset and at a second offset from an initial read level. The results of the dual sense read which are summed together to generate a read error to adjust the read level. In certain embodiments, the one or more iterations of DSBB forms a substantially linear read error gradient converging near or at the ideal read level. In certain embodiments, DSBB is implemented in an individual logic circuit included with each NAND flash die, which reduces bandwidth usage and power consumption of the storage device controller.

In one embodiment, a method of reading a randomized data pattern stored in an array of memory cells includes performing one or more iterations of a DSBB to provide a read level. Each iteration of the DSBB includes performing a first sense read, performing a second sense read, determining a read error, and adjusting the initial read level. The first sense read is performed at a first offset of an initial read level of memory cells to determine a first number of memory cells relative to the first offset. The second sense read is performed at a second offset of the initial read level of memory cells to determine a second number of memory cells relative to the second offset. A read error of the initial read level is determined from the first sense read and the second sense read. The initial read level is adjusted by the read error to provide an adjusted read level. A read of the randomized data pattern is conducted with the read level of the adjusted read level of a last iteration of the DSBB.

In one embodiment, a flash memory die includes an array of memory cells and a logic circuit. The array of memory cells is configured to store a randomized data pattern. The logic circuit is configured to perform one or more iterations of a DSBB to provide a read level. Each iteration of the DSBB includes performing a first sense read, performing a second sense read, determining a read error, and adjusting the initial read level. The first sense read is performed at a first offset of an initial read level of memory cells to determine a first number of memory cells relative to the first offset. The second sense read is performed at a second offset of the initial read level of memory cells to determine a second number of memory cells relative to the second offset. A read error of the initial read level is determined from the first sense read and the second sense read. The initial read level is adjusted by the read error to provide an adjusted read level.

In another embodiment, a method of reading a randomized data pattern stored in an array of memory cells includes performing a first plurality of iterations to provide a first read level and a second plurality of iterations to provide a second read level. Each iteration of the first plurality of iterations includes performing a first sense read, performing a second sense read, determining a read error, and adjusting the initial first read level. The first sense read is performed at a first offset of an initial first read level of memory cells to determine a first number of memory cells relative to the first offset. The second sense read is performed at a second offset of the initial read level of memory cells to determine a second number of memory cells relative to the second offset. A read error of the initial first read level is determined from the first sense read and the second sense read. The initial first read level is adjusted by the read error to provide an adjusted first read level. Each iteration of the second plurality of iterations includes performing a first sense read, performing a second sense read, determining a read error, and adjusting the initial second read level. The first sense read is performed at a first offset of an initial second read level of memory cells to determine a first number of memory cells relative to the first offset. The second sense read is performed at a second offset of the initial second read level of memory cells to determine a second number of memory cells relative to the second offset. A read error of the initial second read level is determined from the first sense read and the second sense read. The initial second read level is adjusted by the read error to provide an adjusted second read level. A read of the randomized data pattern is conducted with the adjusted first read level of a last iteration of the first plurality of iterations and with the adjusted second read level of a last iteration of the second plurality of iterations.

EXAMPLES

The Examples are not meant to limit the scope of the claims unless expressly recited as part of the claims.

Example 1

Figure 10:
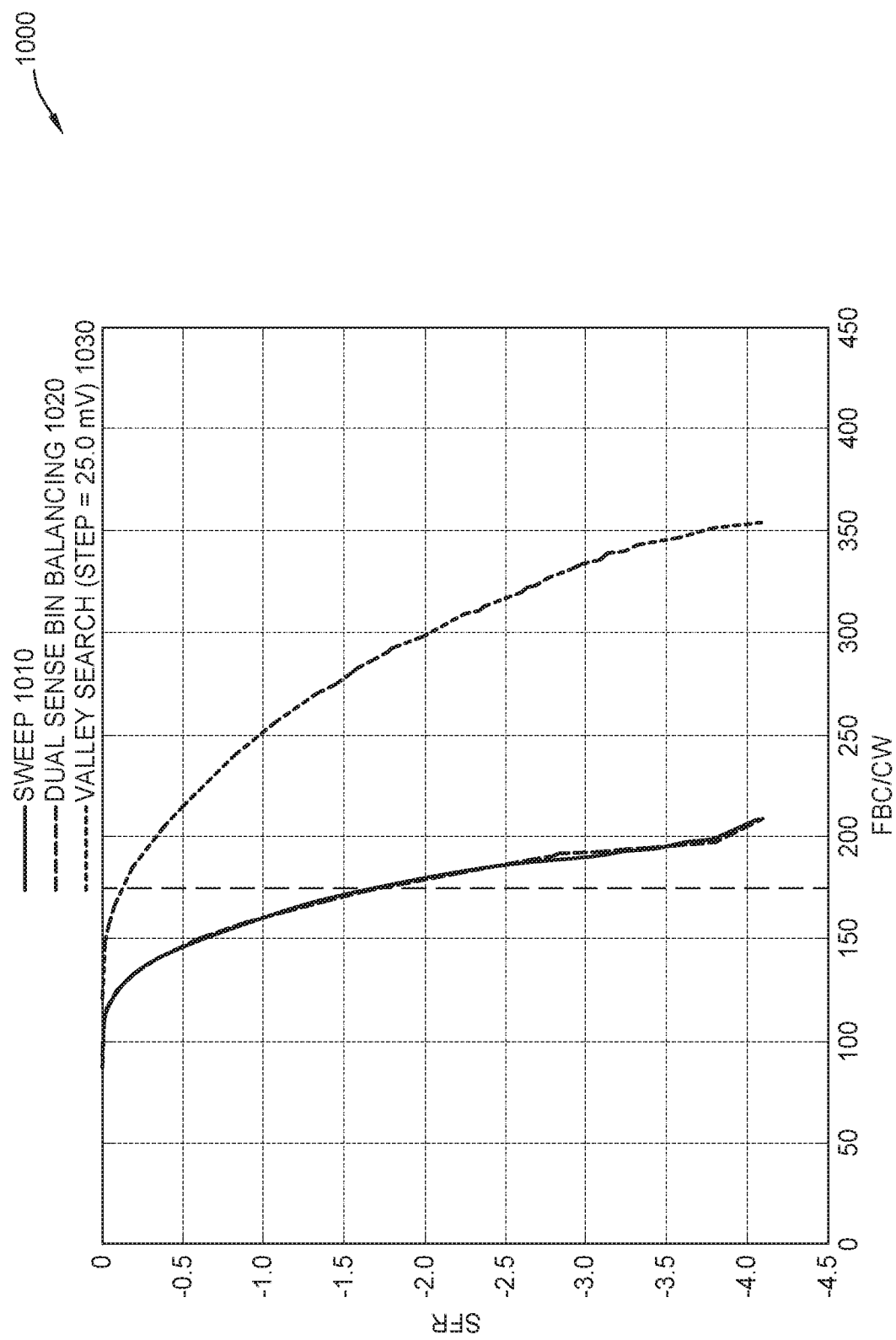
FIG. 10 is a chart of an example comparing a prior art VS and one embodiment of a DSBB.

FIG. 10 is a chart 1000 of an example comparing a prior art VS and one embodiment of a DSBB. In the example of FIG. 10, a BiCS 4×4 NAND die was cycled with 3,000 program/erase times and baked at about 85° C. for about 40 hours as a simulation of approximately the end of life of the NAND die and retention of data for about one year. The sector failure rate (SFR) was plotted on the y-axis and the failed bit count (FBC) over code word (CW) was plotted on the x-axis.

Three methods were performed to adjust the read level: (1) a manual sweep 1010, (2) a DSBB 1020, and (3) a VS 1030. The manual sweep 1010 of read thresholds was conducted to determine the ideal read levels for reference. The DSBB 1020 was conducted with three iterations of DSBB for each read level. The VS 1030 was conducted with eight measurements of incrementing senses for each read level. The SFR versus FBC/CW of each of methods were plotted.

Chart 1000 shows that DSBB 1020 performs approximately the same as the ideal reference manual threshold sweep 1010 of the read thresholds using FBC/CW as a metric. DSBB 1020 shows a large improvement in accuracy (e.g., lower FBC/CW) in comparison to VS 1030

Example 2

Figure 11:
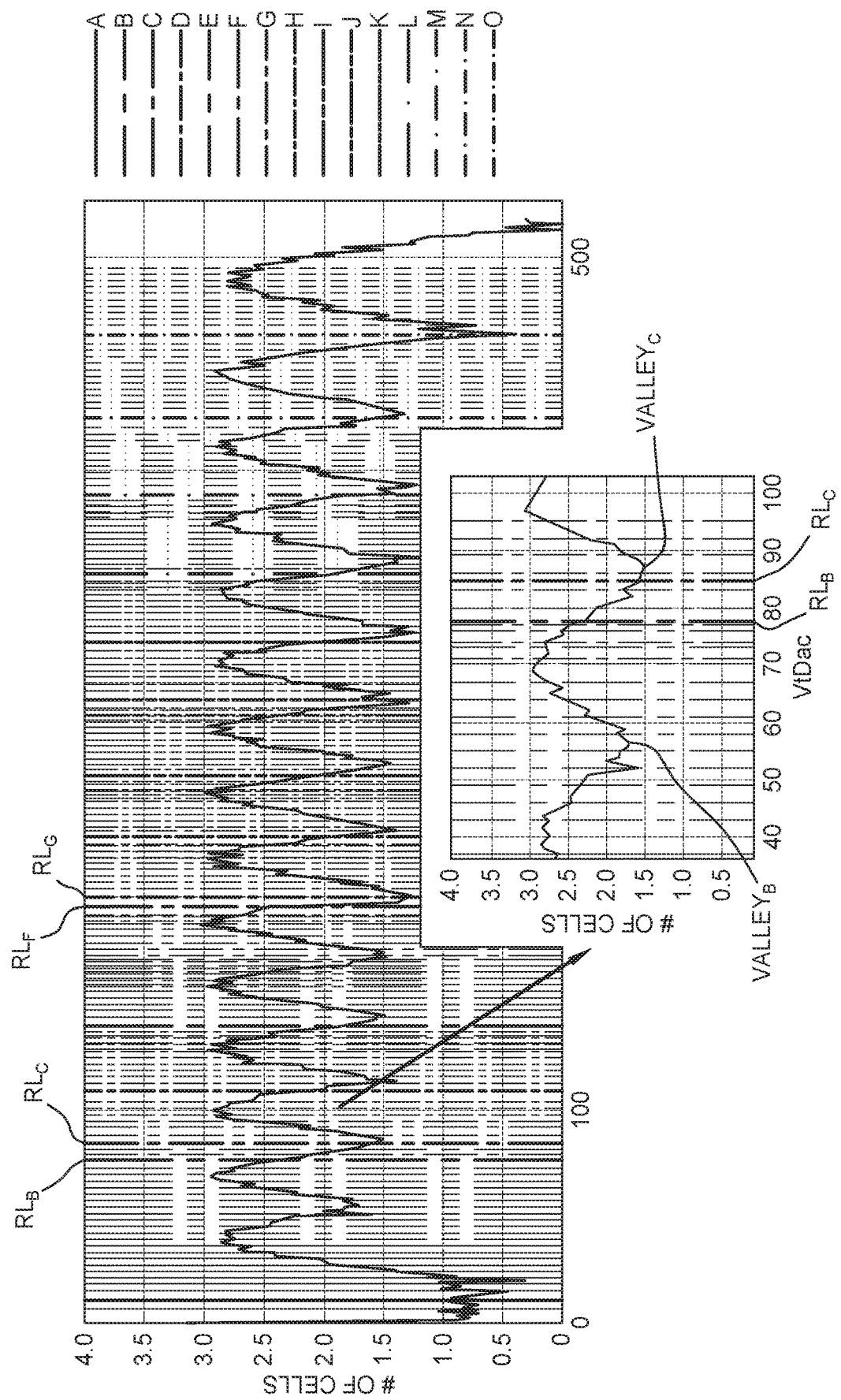
FIG. 11 is a chart of example of the prior art VS determining a false minimum in a neighboring valley.

FIG. 11 is a chart of an example of the prior art VS determining a false minimum in a neighboring valley. The VS includes determining 15 read levels for an array of QLC memory cells with a sweep range for each read level of 37.5 mV for an overall sweep range of 562.5 mV. The dashed lines indicated the fixed measurement locations of the sweep of incrementing senses at fixed threshold voltages for each read level.

VS erroneously determines a read level B ($RL_B$) in the valley C for read level C ($RL_C$) and erroneously determines a demarcation threshold voltage read level F ($RL_F$) in the valley G for read level G ($RL_G$).

While the foregoing is directed to embodiments of the present disclosure, other and further embodiments of the disclosure may be devised without departing from the basic scope thereof, and the scope thereof is determined by the claims that follow.

What is claimed is:

1. A method of reading a randomized data pattern stored in an array of memory cells, comprising:
   performing one or more iterations of a dual sense bin balancing (DSBB) to provide a read level, each iteration of the dual sense bin balancing comprising:
      performing a first sense read at a first offset of an initial read level of memory cells to determine a first number of memory cells relative to the first offset, wherein the first offset is at a first nominal bin width from the initial read level;
      performing a second sense read at a second offset of the initial read level of memory cells to determine a second number of memory cells relative to the second offset, wherein the second offset is at a second nominal bin width from the initial read level, wherein the second nominal bin width and the first nominal bin width are equal, wherein the second offset is opposite of the first offset from the initial read level, and wherein the first nominal bin width and the second nominal bin width is a quarter of a bin width;
      determining a read error of the initial read level from the first sense read and the second sense read; and
      adjusting the initial read level by the read error to provide an adjusted read level; and
   conducting a read of the randomized data pattern with the read level of the adjusted read level of a last iteration of the one or more iterations of the dual sense bin balancing.

2. The method of claim 1, wherein the adjusted read level is used as the initial read level in a successive iteration of the DSBB.

3. The method of claim 1, wherein the adjusted read level is at an unfixed location.

4. The method of claim 1, wherein the read error of the one or more iterations the dual sense bin balancing forms a read error gradient that is substantially linear.

5. The method of claim 1, further comprising providing a plurality of read levels by performing the one or more iterations of the dual sense bin balancing for each of the plurality of read levels.

6. The method of claim 1, wherein the read level is between two distributions of cell voltage thresholds of two memory states in which the two distributions have dissimilar curvatures.

7. The method of claim 1, wherein the method is performed by a logic circuit of a flash die containing the array of memory cells.

8. The method of claim 1, further comprising accumulating an accumulated count of the first number of memory cells relative to the first sense read and the second number of memory cells relative to the second sense read.

9. The method of claim 8, further comprising subtracting an expectation value from the accumulated count to determine the read error.

10. A flash memory die, comprising:
    an array of memory cells configured to store a randomized data pattern; and
    a logic circuit configured to perform one or more iterations of a dual sense bin balancing (DSBB) to provide a read level, each iteration of the dual sense bin balancing comprising:
       performing a first sense read at a first offset of an initial read level of memory cells to determine a first number of memory cells relative to the first offset, wherein the first offset is at a first nominal bin width from the initial read level;
       performing a second sense read at a second offset of the initial read level of memory cells to determine a second number of memory cells relative to the second offset, wherein the second offset is at a second nominal bin width from the initial read level, wherein the second nominal bin width and the first nominal bin width are equal, wherein the second offset is opposite of the first offset from the initial read level, and wherein the first nominal bin width and the second nominal bin width is a quarter of a bin width;
       determining a read error of the initial read level from the first sense read and the second sense read; and
       adjusting the initial read level by the read error to provide an adjusted read level.

11. The flash memory die of claim 10, wherein the adjusted read level is used as the initial read level in a successive iteration of the DSBB.

12. The flash memory die of claim 10, wherein the adjusted read level is at an unfixed location.

13. The flash memory die of claim 10, wherein the read error of the one or more iterations the dual sense bin balancing forms a read error gradient that is substantially linear.

14. The flash memory die of claim 10, wherein the logic circuit is configured to provide a plurality of read levels by performing the one or more iterations of the dual sense bin balancing for each of the plurality of read levels.

15. The flash memory die of claim 10, wherein the array of memory cells is selected from a group consisting of single-level cells (SLC), multiple-level cells (MLC), triple-level cells (TLC), quad-level cells (QLC), or five-level cells.

16. The flash memory die of claim 10, wherein the logic circuit comprises an accumulator to accumulate an accumulated count of the first number of memory cells relative to the first sense read and the second number of memory cells relative to the second sense read.

17. The flash memory die of claim 16, wherein the logic circuit further comprises an expectation unit storing an expectation value of balanced bins for the read level, wherein the logic circuit is configured to subtract the expectation value from the accumulated count to determine the read error.

18. A method of reading a randomized data pattern stored in an array of memory cells, comprising:
performing a first plurality of iterations to determine a first read level, each iteration comprising:
performing a first sense read at a first offset of an initial first read level of memory cells to determine a first number of memory cells relative to the first offset, wherein the first offset is at a first nominal bin width from the initial read level;
performing a second sense read at a second offset of the initial first read level of memory cells to determine a second number of memory cells relative to the second offset, wherein the second offset is at a second nominal bin width from the initial read level, wherein the second nominal bin width and the first nominal bin width are equal, wherein the second offset is opposite of the first offset from the initial read level, and wherein the first nominal bin width and the second nominal bin width is a quarter of a bin width;
determining a read error of the initial first read level from the first sense read and the second sense read; and
adjusting the initial first read level by the read error to provide an adjusted first read level;
performing a second plurality of iterations to determine a second read level, each iteration comprising:
performing a first sense read at a first offset of an initial second read level of memory cells to determine a first number of memory cells relative to the first offset;
performing a second sense read at a second offset of the initial second read level of memory cells to determine a second number of memory cells relative to the second offset;
determining a read error of the initial second read level from the first sense read and the second sense read; and
adjusting the initial second read level by the read error to provide an adjusted second read level; and
conducting a read of the randomized data pattern with the adjusted first read level of a last iteration of the first plurality of iterations and with the adjusted second read level of a last iteration of the second plurality of iterations.

19. The method of claim 18, wherein the second plurality of iterations is performed after the first plurality of iterations.

20. The method of claim 18, wherein the method is performed by a logic circuit of a flash die containing the array of memory cells.

* * * * *